(12) United States Patent
Chang et al.

(10) Patent No.: US 11,585,648 B2
(45) Date of Patent: Feb. 21, 2023

(54) ELECTROMAGNETIC MEASURING PROBE DEVICE FOR MEASURING A THICKNESS OF A DIELECTRIC LAYER OF A CIRCUIT BOARD AND METHOD THEREOF

(71) Applicant: Unimicron Technology Corporation, Taoyuan (TW)

(72) Inventors: Cheng-Jui Chang, Taoyuan (TW); Hung-Lin Chang, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 156 days.

(21) Appl. No.: 17/209,839

(22) Filed: Mar. 23, 2021

(65) Prior Publication Data
US 2022/0221263 A1 Jul. 14, 2022

(30) Foreign Application Priority Data
Jan. 14, 2021 (TW) .................................. 110101470

(51) Int. Cl.
*G01B 7/06* (2006.01)
*H05K 1/11* (2006.01)
*H05K 1/02* (2006.01)

(52) U.S. Cl.
CPC ............. *G01B 7/10* (2013.01); *H05K 1/0213* (2013.01); *H05K 1/115* (2013.01); *H05K 2201/083* (2013.01)

(58) Field of Classification Search
None
See application file for complete search history.

(56) References Cited

U.S. PATENT DOCUMENTS

| 6,977,498 B2 * | 12/2005 | Scherzinger | G01B 7/105 324/229 |
| 2006/0049830 A1 | 3/2006 | Jeong et al. | |
| 2020/0348359 A1 | 11/2020 | Weiss et al. | |

FOREIGN PATENT DOCUMENTS

CN 105716563 A * 6/2016 ............. G01B 21/18

* cited by examiner

*Primary Examiner* — Raul J Rios Russo
*Assistant Examiner* — Dilara Sultana
(74) *Attorney, Agent, or Firm* — Alan D. Kamrath; Karin L. Williams; Mayer & Williams PC

(57) ABSTRACT

An electromagnetic measuring probe device for measuring a thickness of a dielectric layer of a circuit board and a method thereof are disclosed. The circuit board has at least one dielectric layer, at least two conductive layers and a test area. The test area has a test pattern and a through hole. The electromagnetic measuring probe device has a probe-measuring unit, an external conductive element, plural magnetic powder groups, and a maintaining unit. The probe-measuring unit has a transparent tube and an internal conductive pin. The external conductive element electrically connects with the test pattern. The conductive layers and the internal conductive pin generate a magnetic field while the probe-measuring unit enters into the through hole. The magnetic powder groups magnetically attracted are gathered to positions corresponding to thickness-range positions of the conductive layers and held by the maintaining unit, thus a gap between the two dielectric layers is obtained.

12 Claims, 5 Drawing Sheets

ELECTROMAGNETIC MEASURING PROBE DEVICE FOR MEASURING A THICKNESS OF A DIELECTRIC LAYER OF A CIRCUIT BOARD AND METHOD THEREOF

BACKGROUND OF THE INVENTION

1. Field of the Invention

The present invention is in related to an electromagnetic measuring probe device for measuring a thickness of a dielectric layer of a circuit board and a method thereof, more particularly to a method, through measuring a plurality of magnetic powder groups, to obtain the thickness of the dielectric layer of the circuit board, and the device thereof.

2. Description of the Prior Art

The structures of the prior circuit boards are formed by insulating and overlapping multiple conductive layers, and the thickness of each dielectric layer may not be the same. After packaging the circuit board, to obtain the thickness of each dielectric layer in the circuit board, the prior arts mainly adopt the destructive/damaging methods to measure the thickness of each dielectric layer. We do know those methods are not only time-consuming and labor-intensive, but also very inconvenient for operations according to our experiences. Larger circuit board areas are destroyed, and then the measured circuit board will be directly scrapped since the destruction/damage.

As it can be seen, a method to measure the thickness of each dielectric layer without the shortcomings of the destruction/damage, non-efficiency. Time-consuming, and labor-intensive is the most important issue to the people who are skilled in the art.

SUMMARY OF THE INVENTION

The first objective of the present invention is to provide an electromagnetic measuring probe device for measuring a thickness of a dielectric layer of a circuit board. The circuit board has at least one dielectric layer, at least two conductive layers and a test area. The test area has a test pattern and a through hole. The test pattern has at least one first conductive portion and at least two second conductive portions. The first conductive portion is through the dielectric layer and connects with the two second conductive portions respectively. The two second conductive portions are parts of the two conductive layers. A conductive area of the second conductive portion is greater than a conductive area of the first conductive portion. An elongating direction of the through hole is vertical to the dielectric layer and the conductive layers. The test pattern accepts power from a power supply in order to let the conductive layers be electrically connected with each other and generate a magnetic field.

The electromagnetic measuring probe device has a probe-measuring unit, an external conductive element, a plurality of magnetic powder groups, and a maintaining unit. The probe-measuring unit is able to move in/out from the through hole of the circuit board, and has a transparent tube and an internal conductive pin. The transparent tube has a tube wall and an accommodation room. The internal conductive pin electrically connects with the power supply. The external conductive element electrically connects with the power supply and the second conductive portion of the test pattern. The conductive layers and the internal conductive pin generate the magnetic field while the probe-measuring unit enters into the through hole. The plurality of magnetic powder groups are in the accommodation room of the transparent tube. The magnetic powder groups are attracted by the magnetic field and gathered to positions where correspond to thickness-range positions of the conductive layers. The maintaining unit is in the accommodation room. The maintaining unit holds the plurality of magnetic powder groups on the positions where correspond to the thickness-range positions of the conductive layers respectively after the probe-measuring unit moves out from the through hole of the circuit board. A gap between the two magnetic powder groups corresponds to a gap between the two thickness-range positions of the two dielectric layers.

The second objective of the present invention is to provide a method for using the electromagnetic measuring probe device to measure the thickness of the dielectric layer of the circuit board. The circuit board has at least one dielectric layer, at least two conductive layers and a test area. The test area has a test pattern and a through hole. The test pattern has at least one first conductive portion and at least two second conductive portions. The first conductive portion is through the dielectric layer and connects with the two second conductive portions respectively. The two second conductive portions are a part of each of the two conductive layers. A conductive area of the second conductive portion is greater than a conductive area of the first conductive portion. An elongating direction of the through hole is vertical to the dielectric layer and the conductive layers. The test pattern accepts power from a power supply in order to let the conductive layers be electrically connected with each other and generate a magnetic field. The electromagnetic measuring probe device has a probe-measuring unit, an external conductive element, a plurality of magnetic powder groups, and a maintaining unit. The probe-measuring unit has a transparent tube and an internal conductive pin. The transparent tube has a tube wall and an accommodation room. The internal conductive pin electrically connects with the power supply. The plurality of magnetic powder groups are in the accommodation room of the transparent tube. The method comprises the steps of: (a) inserting the probe-measuring unit into the through hole, connecting the external conductive element with the second conductive portion of the test pattern; (b) electrically connecting the external conductive element with the second conductive portion of the test pattern, so as to let the conductive layers and the internal conductive pin generate the magnetic field, then the magnetic powder groups being attracted by the magnetic field and gathered to positions where correspond to thickness-range positions of the conductive layers; and (c) moving the probe-measuring unit out from the through hole, and the maintaining unit holding the plurality of magnetic powder groups on the positions where correspond to the thickness-range positions of the conductive layers, a gap between the two magnetic powder groups corresponding to a gap between the two thickness-range positions of the two dielectric layers.

The present invention is an electromagnetic measuring probe device for measuring a thickness of a dielectric layer of a circuit board and a method thereof. It is to conduct the conductive layers for generating a magnetic field. The magnetic powder groups attracted by the magnetic field are held in the transparent tube. Then each gap between the two magnetic powder groups is analyzed in order to obtain the thickness of the dielectric layer. As it can be seen, the structure of the circuit board may not be damaged. It makes an efficient measuring method, and avoid the cost of damaging circuit boards. So, above mentioned objectives are approached.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE INVENTION

Figure 1:
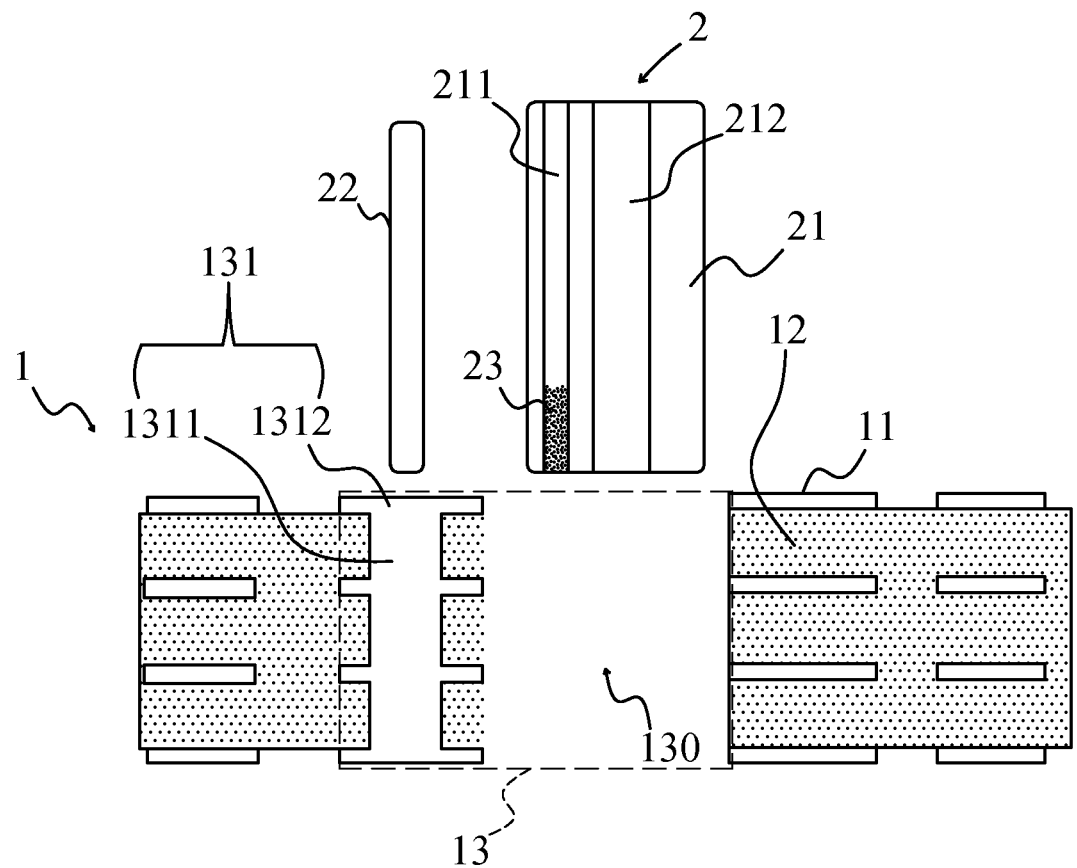
FIG. 1 illustrates a schematic view of a preferred embodiment of an electromagnetic probe device for measuring a thickness of a dielectric layer of a circuit board of the present invention.

In order to describe in detail the technical content, structural features, achieved objectives and effects of the instant application, the following detailed descriptions are given in conjunction with the drawings and specific embodiments. It should be understood that these embodiments are only used to illustrate the application and not to limit the scope of the instant application.

With reference to FIG. 1, FIG. 2, FIG. 3, and FIG. 4, which illustrate schematic views of a preferred embodiment of an electromagnetic probe device for measuring a thickness of a dielectric layer of the present invention. The circuit board 1 has at least one dielectric layer 12, at least two conductive layers 11 and a test area 13. The test area 13 has a test pattern 131 and a through hole 130. The test pattern 131 has at least one first conductive portion 1311 and at least two second conductive portions 1312. The second conductive portions 1312 and the test area 13 are formed simultaneously while making the circuit board 1. The first conductive portion 1311 is formed by that of penetrating through the dielectric layer 12 and depositing metal. The first conductive portion 1311 is through the dielectric layers 12 and connects with the two second conductive portions 1312. The two second conductive portion 1312 are parts of the conductive layers 11, and a conductive area of the second conductive portion 1312 is greater than a conductive area of the first conductive portion 1311.

Figure 3:
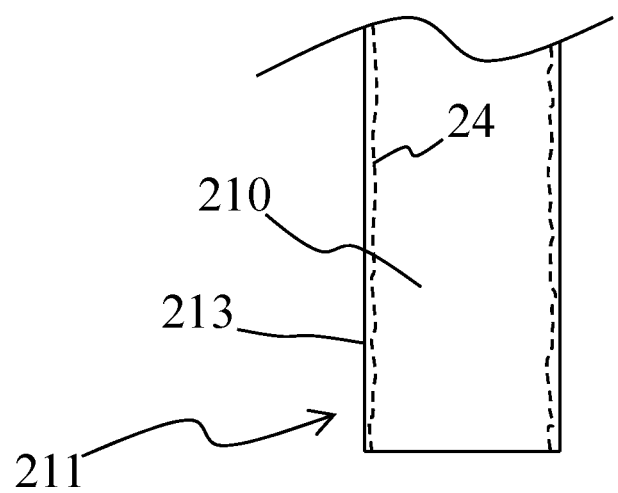
FIG. 3 illustrates a schematic view of a rough layer formed on a transparent tube of the probe-measuring unit of the electromagnetic probe device of the present invention.

The electromagnetic measuring probe device 2 has a probe-measuring unit 21, an external conductive element 22, a plurality of magnetic powder groups 23, and a maintaining unit. The probe-measuring unit 21 has a transparent tube 211 and an internal conductive pin 212. The transparent tube 211 has a tube wall 213 and an accommodation room 210, as shown in FIG. 3. The internal conductive pin 212 and the external conductive element 22 electrically connect with a power supply. As shown in FIG. 3, the maintaining unit is a rough layer 24 which is in the accommodation room 210 and is formed on the tube wall 213 and toward the accommodation room 210. For the preferred embodiment, the magnetic powder group 23 is made of iron oxide magnetic powder and injected into the accommodation room 210 of the transparent tube 211.

Figure 4:
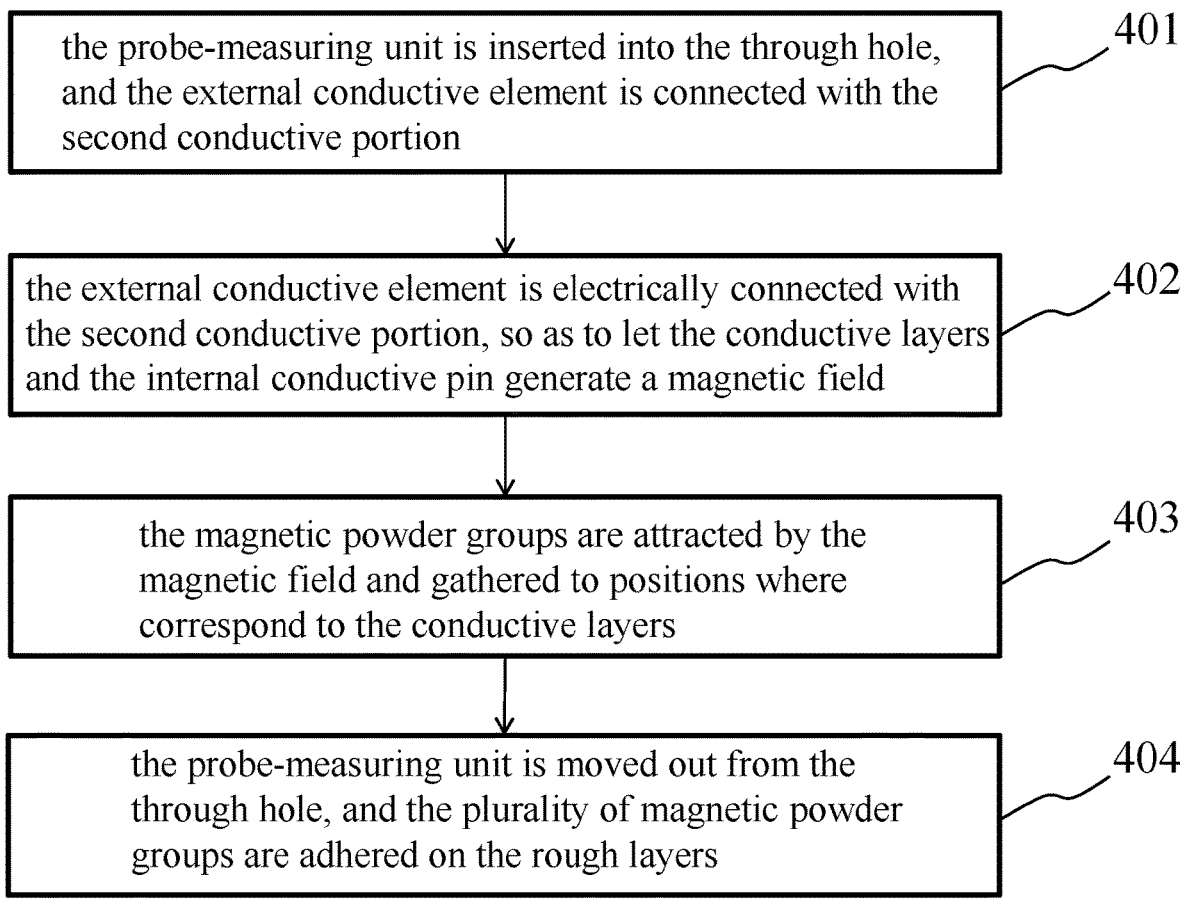
FIG. 4 illustrates a flow chart of a method for using the electromagnetic measuring probe device to measure the thickness of the dielectric layer of the circuit board of the present invention.

With reference to FIG. 4, which is a flow chart of a method for using the electromagnetic measuring probe device to measure the thickness of the dielectric layer of the circuit board. For a step (401), the probe-measuring unit 21 is inserted into the through hole 130, and the external conductive element 22 is connected with the second conductive portion 1312 of the test pattern 131. A step (402) shows that the external conductive element 22 is electrically connected with the second conductive portion 1312 of the test pattern 131, so as to let the internal conductive pin 212 and the external conductive element 22 be on a same circuit loop, and then the conductive layers 11 and the internal conductive pin (212) generate a magnetic field. As shown in a step (403), the magnetic powder groups 23 are attracted by the magnetic field and gathered to positions where correspond to thickness-range positions of the conductive layers 11. Continuously, regarding to a step (404), the probe-measuring unit 21 is moved out from the through hole 130, and the plurality of magnetic powder groups 23 are adhered on the positions, the rough layers 24 of the tube wall 213, where correspond to the thickness-range positions of the conductive layers 11, wherein a gap between the two magnetic powder groups 23 corresponds to a gap between the two thickness-range positions of the two dielectric layers 12, and therefore the thickness-range position of each dielectric layer 12 is gained through the electromagnetic measuring method.

Figure 2:
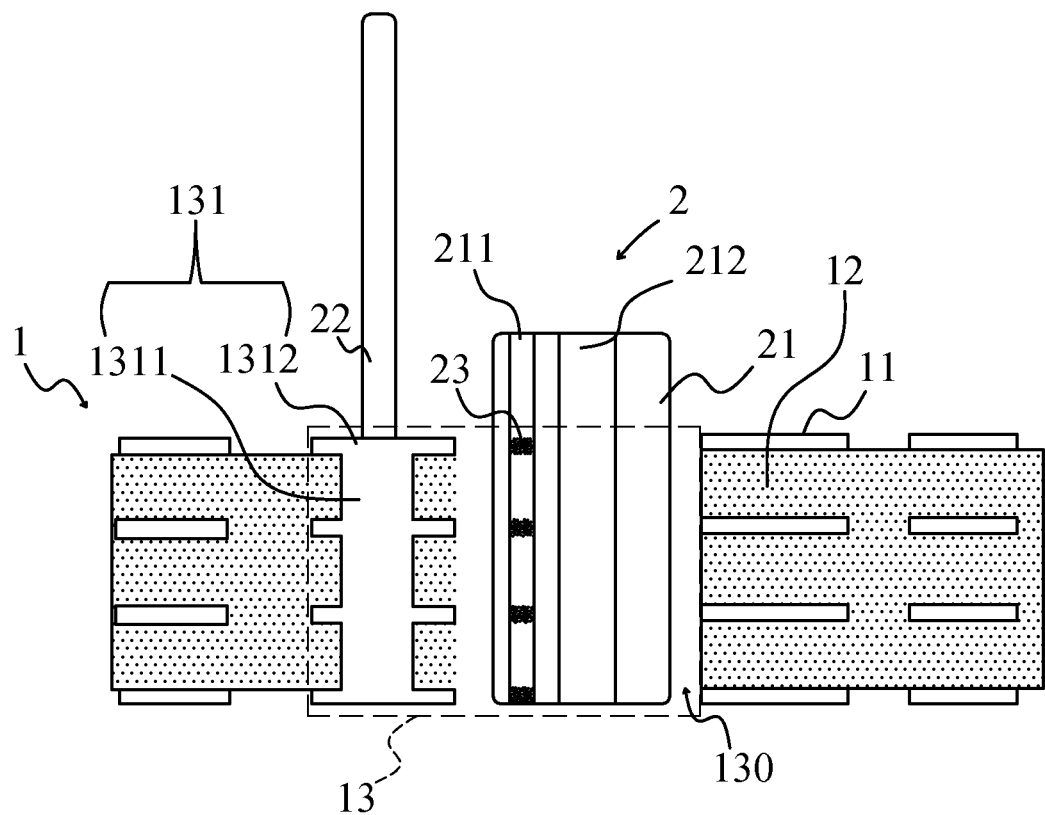
FIG. 2 illustrates a schematic view of a probe-measuring unit of the electromagnetic probe device going into a through hole of the circuit board of the present invention.
Figure 5:
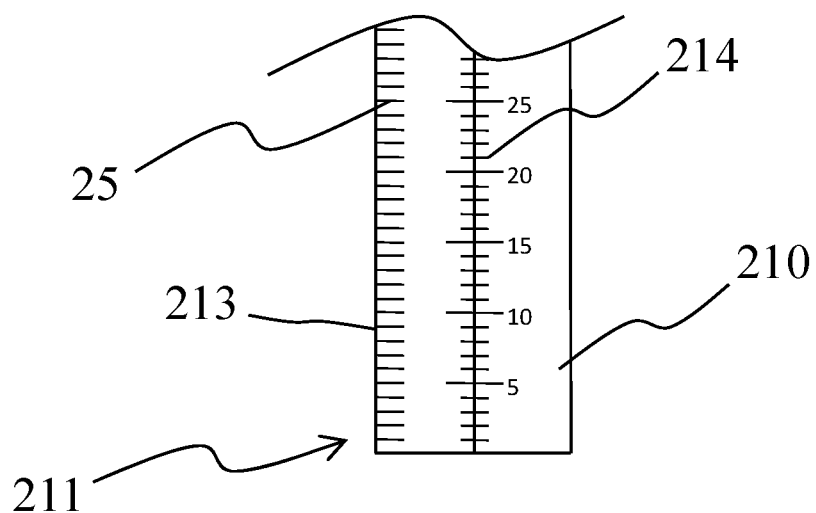
FIG. 5 illustrates a schematic view of another preferred embodiment of the electromagnetic probe device for measuring the thickness of the dielectric layer of the present invention.

With reference to FIG. 1, FIG. 2 and FIG. 5, which illustrate schematic views of another preferred embodiment of the electromagnetic probe device for measuring the thickness of the dielectric layer of the present invention. According to the embodiment, the maintaining unit has a plurality of compartments 25 formed on the tube wall 213 and protrudes toward the accommodation room 210, and the plurality of magnetic powder groups 23 attracted by the magnetic field are accommodated by the plurality of compartments 25. In addition, a gap between any two compartments 25 is the same as the other and is 1 mm. There are a plurality of graduations 214 on the tube wall 213 of the transparent tube 211, and the graduations 214 correspond to the compartments 25. So, the thickness-range position of each dielectric layer 12 is easily gained when the transparent tube 211 moves out from the through hole 130.

Figure 6:
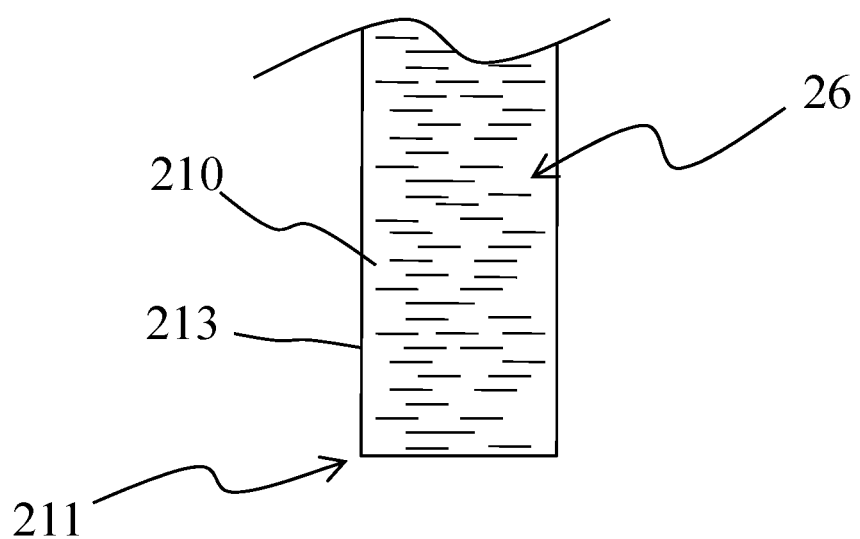
FIG. 6 illustrates a schematic view of a third preferred embodiment of the electromagnetic probe device for measuring the thickness of the dielectric layer of the present invention.

According to FIG. 1, FIG. 2 and FIG. 6, which illustrate schematic views of a third preferred embodiment of the electromagnetic probe device for measuring the thickness of the dielectric layer of the present invention. Based on the embodiment, the maintaining unit is colloid 26 with a pre-established density contained by the accommodation room 210 of the transparent tube 211. A floating force from the plurality of magnetic powder groups 23 attracted by the magnetic field in order to hold the magnetic powder groups 23 in the transparent tube 211, wherein the pre-established density of the colloid 26 approaches a density of the magnetic powder groups 23.

The present invention is an electromagnetic measuring probe device for measuring a thickness of a dielectric layer of a circuit board and a method thereof. It is to conduct the conductive layers 11 for generating a magnetic field. The magnetic powder groups 23 attracted by the magnetic field are held in the transparent tube 211. Then each gap between the two magnetic powder groups 23 is analyzed in order to obtain the thickness of the dielectric layer 12. As it can be seen, the structure of the circuit board 1 may not be damaged. It makes an efficient measuring method, and avoid the cost of damaging circuit boards.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims

What is claimed is:

1. An electromagnetic measuring probe device (2) for measuring a thickness of a dielectric layer (12) of a circuit board (1), the circuit board (1) comprising at least one dielectric layer (12), at least two conductive layers (11) and a test area (13), the test area (13) having a test pattern (131) and a through hole (130), the test pattern (131) having at least one first conductive portion (1311) and at least two second conductive portions (1312), the first conductive portion (1311) being through the dielectric layer (12) and connecting with the two second conductive portions (1312) respectively, the two second conductive portions (1312) being parts of the two conductive layers (11), a conductive area of the second conductive portion (1312) being greater than a conductive area of the first conductive portion (1311), an elongating direction of the through hole (130) being vertical to the dielectric layer (12) and the conductive layers (11), the test pattern (131) accepting power from a power supply in order to let the conductive layers (11) be electrically connected with each other and generate a magnetic field, comprising:
   a probe-measuring unit (21), able to move in/out from the through hole (130) of the circuit board (1), having a transparent tube (211) and an internal conductive pin (212), the transparent tube (211) having a tube wall (213) and an accommodation room (210), the internal conductive pin (212) electrically connecting with the power supply;
   an external conductive element (22), electrically connecting with the power supply and the second conductive portion (1312) of the test pattern (131), the conductive layers (11) and the internal conductive pin (212) generating the magnetic field while the probe-measuring unit (21) enters into the through hole (130);
   a plurality of magnetic powder groups (23), being in the accommodation room (210) of the transparent tube (211), the magnetic powder groups (23) being attracted by the magnetic field and gathered to positions where correspond to thickness-range positions of the conductive layers (11); and
   a maintaining unit, being in the accommodation room (210), the maintaining unit holding the plurality of magnetic powder groups (23) on the positions where correspond to the thickness-range positions of the conductive layers (11) respectively after the probe-measuring unit (21) moves out from the through hole (130) of the circuit board (1), a gap between the two magnetic powder groups (23) corresponding to a gap between the two thickness-range positions of the two dielectric layers (12).

2. The electromagnetic measuring probe device (2) for measuring the thickness of the dielectric layer of the circuit board according to claim 1, wherein the internal conductive pin (212) and the external conductive element (22) is on a same circuit loop.

3. The electromagnetic measuring probe device (2) for measuring the thickness of the dielectric layer of the circuit board according to claim 1, wherein the maintaining unit is a rough layer (24) formed on the tube wall (213) and toward the accommodation room (210), the plurality of magnetic powder groups (23) attracted by the magnetic field being adhered to the rough layer (24).

4. The electromagnetic measuring probe device (2) for measuring the thickness of the dielectric layer of the circuit board according to claim 1, wherein the maintaining unit has a plurality of compartments (25) formed on the tube wall (213) and protrudes toward the accommodation room (210), the plurality of magnetic powder groups (23) attracted by the magnetic field being accommodated by the plurality of compartments (25).

5. The electromagnetic measuring probe device (2) for measuring the thickness of the dielectric layer of the circuit board according to claim 1, wherein a plurality of graduations (214) on the tube wall (213) of the transparent tube (211).

6. The electromagnetic measuring probe device (2) for measuring the thickness of the dielectric layer of the circuit board according to claim 1, wherein the maintaining unit is colloid (26) with a pre-established density contained by the accommodation room (210) of the transparent tube (211), a floating force from the plurality of magnetic powder groups (23) attracted by the magnetic field in order to hold the magnetic powder groups (23) in the transparent tube (211), wherein the pre-established density of the colloid (26) approaches a density of the magnetic powder groups (23).

7. The electromagnetic measuring probe device (2) for measuring the thickness of the dielectric layer of the circuit board according to claim 6, wherein the magnetic powder group (23) is made of iron oxide magnetic powder.

8. A method for using an electromagnetic measuring probe device (2) to measure a thickness of a dielectric layer (12) of a circuit board (1), the circuit board (1) comprising at least one dielectric layer (12), at least two conductive layers (11) and a test area (13), the test area (13) having a test pattern (131) and a through hole (130), the test pattern (131) having at least one first conductive portion (1311) and at least two second conductive portions (1312), the first conductive portion (1311) being through the dielectric layer (12) and connecting with the two second conductive portions (1312) respectively, the two second conductive portions (1312) being a part of each of the two conductive layers (11), a conductive area of the second conductive portion (1312) being greater than a conductive area of the first conductive portion (1311), an elongating direction of the through hole (130) being vertical to the dielectric layer (12) and the conductive layers (11), the test pattern (131) accepting power from a power supply in order to let the conductive layers (11) be electrically connected with each other and generate a magnetic field, the electromagnetic measuring probe device (2) comprising a probe-measuring unit (21), an external conductive element (22), a plurality of magnetic powder groups (23), and a maintaining unit, the probe-measuring unit (21) having a transparent tube (211) and an internal conductive pin (212), the transparent tube (211) having a tube wall (213) and an accommodation room (210), the internal conductive pin (212) electrically connecting with the power supply, the plurality of magnetic powder groups (23), being in the accommodation room (210) of the transparent tube (211), comprising the steps of:

(a) inserting the probe-measuring unit (21) into the through hole (130), connecting the external conductive element (22) with the second conductive portion (1312) of the test pattern (131);

(b) electrically connecting the external conductive element (22) with the second conductive portion (1312) of the test pattern (131), so as to let the conductive layers (11) and the internal conductive pin (212) generate the magnetic field, then the magnetic powder groups (23) being attracted by the magnetic field and gathered to positions where correspond to thickness-range positions of the conductive layers (11); and (c) moving the probe-measuring unit (21) out from the through hole (130), and the maintaining unit holding the plurality of magnetic powder groups (23) on the positions where correspond to the thickness-range positions of the conductive layers (11), a gap between the two magnetic powder groups (23) corresponding to a gap between the two thickness-range positions of the two dielectric layers (12).

9. The method for using the electromagnetic measuring probe device (2) to measure the thickness of the dielectric layer (12) of the circuit board (1) according to claim 8, wherein the maintaining unit is a rough layer formed on the tube wall (213) and toward the accommodation room (210), the plurality of magnetic powder groups (23) being adhered to the rough layer in the step (c).

10. The method for using the electromagnetic measuring probe device (2) to measure the thickness of the dielectric layer (12) of the circuit board (1) according to claim 8, wherein the maintaining unit has a plurality of compartments (25) formed on the tube wall (213) and protrudes toward the accommodation room (210), the plurality of magnetic powder groups (23) being accommodated by the plurality of compartments (25) in the step (c).

11. The method for using the electromagnetic measuring probe device (2) to measure the thickness of the dielectric layer (12) of the circuit board (1) according to claim 8, wherein the maintaining unit is colloid with a pre-established density contained by the accommodation room (210) of the transparent tube (211), a floating force from the colloid holding the plurality of magnetic powder groups (23) in the transparent tube (211), the pre-established density of the colloid approaching a density of the magnetic powder groups (23).

12. The method for using the electromagnetic measuring probe device (2) to measure the thickness of the dielectric layer (12) of the circuit board (1) according to claim 11, wherein the magnetic powder group (23) is made of iron oxide magnetic powder.

\* \* \* \* \*